(12) United States Patent
Van Den Heuvel et al.

(10) Patent No.: US 7,843,548 B2
(45) Date of Patent: Nov. 30, 2010

(54) CONDUIT SYSTEM FOR A LITHOGRAPHIC APPARATUS, LITHOGRAPHIC APPARATUS, PUMP, AND METHOD FOR SUBSTANTIALLY REDUCING VIBRATIONS IN A CONDUIT SYSTEM

(75) Inventors: Martinus Wilhelmus Van Den Heuvel, Best (NL); Johannes Christiaan Leonardus Franken, Knegsel (NL); Josephus Cornelis Johannes Antonlus Vugts, Goirle (NL)

(73) Assignee: ASML Netherlands B.V., Veldhoven (NL)

( * ) Notice: Subject to any disclaimer, the term of this patent is extended or adjusted under 35 U.S.C. 154(b) by 178 days.

(21) Appl. No.: 11/907,964

(22) Filed: Oct. 18, 2007

(65) Prior Publication Data
US 2008/0143001 A1 Jun. 19, 2008

Related U.S. Application Data

(60) Provisional application No. 61/007,904, filed on Nov. 13, 2006.

(51) Int. Cl.
*G03B 27/52* (2006.01)
*G03B 27/42* (2006.01)
(52) U.S. Cl. .......................... 355/30; 355/53
(58) Field of Classification Search .................. 355/30, 355/53; 417/54
See application file for complete search history.

(56) References Cited

U.S. PATENT DOCUMENTS 3,171,351 A 3/1965 Shetler
3,269,318 A 8/1966 Telford et al.
4,509,852 A 4/1985 Tabarelli et al.
4,903,793 A * 2/1990 Firey ........................... 181/0.5
5,779,439 A 7/1998 Dufour
2001/0043314 A1* 11/2001 Ota ............................... 355/30
2004/0165159 A1 8/2004 Lof et al.
2005/0134815 A1 6/2005 Van Santen et al.
2006/0023184 A1 2/2006 Coon et al.
2006/0050257 A1* 3/2006 Honda .......................... 355/67
2007/0128047 A1* 6/2007 Gonnella et al. ............... 417/2
2008/0188810 A1* 8/2008 Larsen et al. ................ 604/152

FOREIGN PATENT DOCUMENTS

EP 1 520 986 B1 5/2005
WO WO 99/49504 9/1999
WO WO 02/090771 A2 11/2002

OTHER PUBLICATIONS

Search Report and Written Opinion for Singapore Application/Patent No. 0717221-6 dated Feb. 6, 2009.
Chinese Office Action for Chinese Patent Application No. 200710168155.6 dated Aug. 7, 2009.

* cited by examiner

*Primary Examiner*—Peter B Kim
(74) *Attorney, Agent, or Firm*—Pillsbury Winthrop Shaw Pittman LLP

(57) ABSTRACT

A conduit system for a lithographic apparatus is disclosed, the conduit system including a conduit configured to guide a liquid or liquid-gas mixture, and a gas injection nozzle configured to introduce a gas in the liquid or liquid-gas mixture to at least partially absorb pressure peaks or waves in the liquid or liquid-gas mixture. In an embodiment, the gas injection nozzle may be arranged in a pump of the conduit system. The pump further includes a pump inlet, a pump outlet and a pump chamber between the pump inlet and the pump outlet arranged for compression of the liquid or liquid-gas mixture.

19 Claims, 5 Drawing Sheets

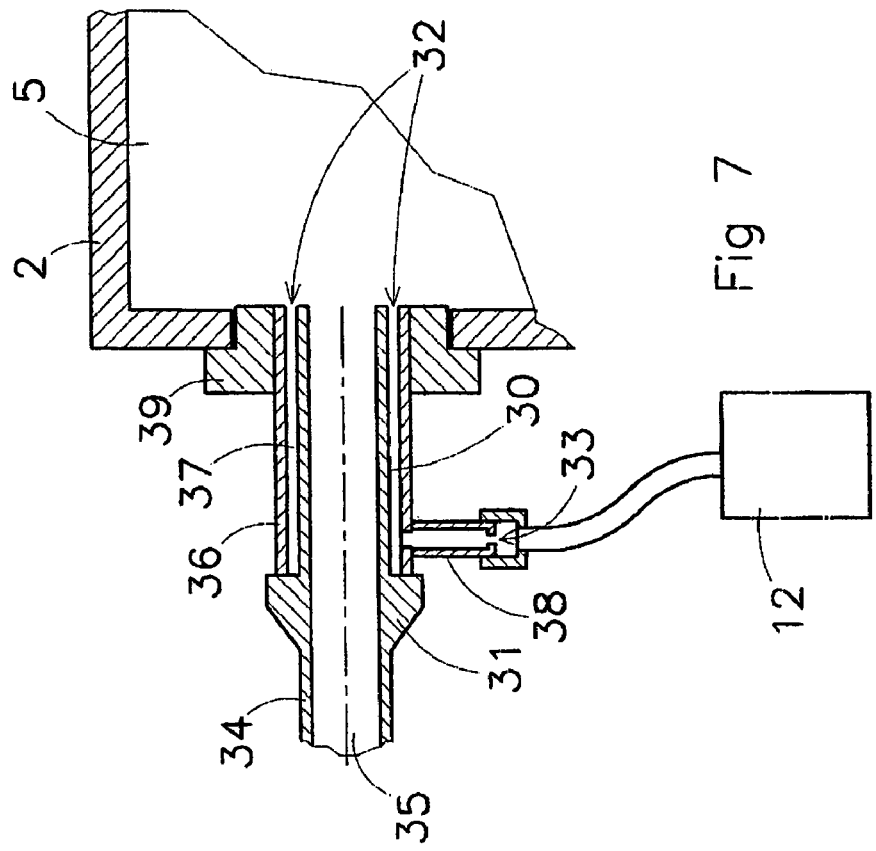
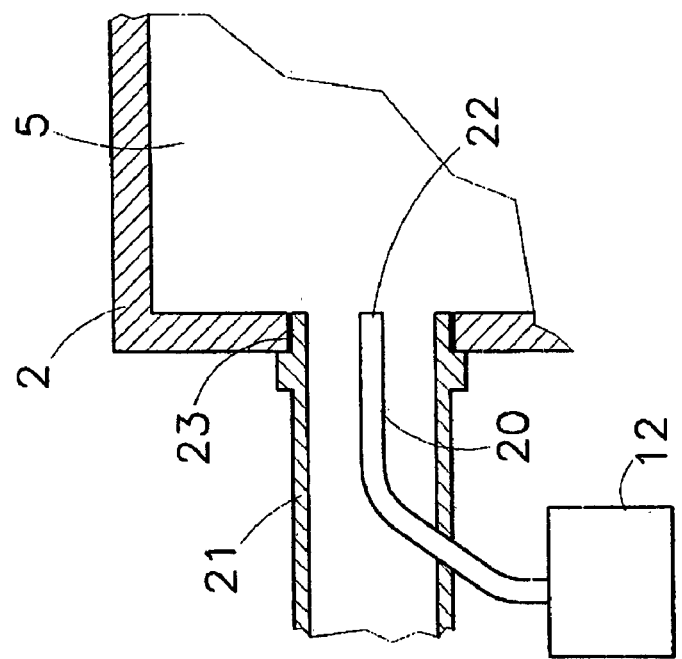

CONDUIT SYSTEM FOR A LITHOGRAPHIC APPARATUS, LITHOGRAPHIC APPARATUS, PUMP, AND METHOD FOR SUBSTANTIALLY REDUCING VIBRATIONS IN A CONDUIT SYSTEM

This application claims priority to and benefit from U.S. Provisional Patent Application No. 61/007,904, filed Nov. 13, 2006, the entire contents of which is hereby incorporated by reference.

FIELD

The present invention relates to a conduit system for a lithographic apparatus, a lithographic apparatus, a pump, and a method for substantially reducing vibrations in a conduit system of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to provide an immersion system in a lithographic projection apparatus to immerse the substrate in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This may require additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid supply system (the substrate generally has a larger surface area than the final element of the projection system). One way which has been proposed to arrange for this is disclosed in PCT patent application publication WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets situated around the final element are possible, one example is illustrated in FIG. 3 in which four sets of an inlet with an outlet on either side are provided in a regular pattern around the final element.

Other examples of a lithographic apparatus comprising an immersion system are, for instance, disclosed in U.S. patent application publication nos. 2004/0165159 A1 and 2005/0134815 A1, both hereby incorporated in their entirety by reference.

When an immersion system is provided in a lithographic apparatus, use may be made of one or more pumps to pump liquid to or from the immersion space between a projection system and a substrate supported on a substrate table. A suitable pump to be used for an immersion system is, for instance, a membrane pump which may provide a substantially constant volume flow. Such a pump comprises a pump chamber having a volume which may be subsequently increased and decreased to provide a pump flow.

SUMMARY

When a membrane pump is used to pump liquid away from the immersion space, the pump should be suitable to pump a liquid flow but also a liquid-gas mixture since at a certain moment a considerable amount of liquid will be removed from the immersion space and, as a consequence, both liquid and gas will be sucked into the conduit which connects the pump with the immersion space.

A drawback of such a pump for an immersion system of a lithographic apparatus is that when only liquid is pumped by the pump, the compression of liquid in the pump chamber of the pump may lead to pressure peaks or waves in the liquid and, consequently, to vibrations in the mechanical parts of the pump. These vibrations may have a negative influence on the projection accuracy of the lithographic apparatus.

The same drawback may also occur in a gear pump, in which compression of fluid may lead to pressure peaks and waves in the liquid and, as a result, to vibrations in the lithographic system. Such pumps may be used in an immersion system or another conduit system in a lithographic apparatus. For instance, the rotary movement of the gears of a gear pump in a cooling circuit and the resulting compression of liquid may have this result. Other types of pumps in which liquid is compressed may have the same or similar effects.

Furthermore or alternatively, a liquid flow flowing through a conduit, for instance a conduit of a cooling system or an immersion system, may cause pressure peaks, pressure waves and/or vibrations, in particular when the liquid is going through a corner or a restriction. Such vibrations may in particular occur in a liquid conduit system having a relatively complex geometry, as for instance may be the case in a cooling circuit or an immersion system.

It is desirable to provide a pump for an immersion system in which vibrations due to compression of liquid in the pump chamber of the pump are substantially reduced.

It is desirable to provide a conduit system for liquid flow, in particular of an immersion system in which vibrations caused by liquid flow or by liquid compression are reduced.

According to an embodiment of the invention, there is provided a conduit system for a lithographic apparatus. The conduit system includes a conduit configured to guide a liquid or liquid-gas mixture, and a gas injection nozzle configured to introduce a gas in the liquid or liquid-gas mixture to at least partially absorb pressure peaks or waves in the liquid or liquid-gas mixture.

According to an embodiment of the invention, there is provided a lithographic apparatus that includes an illumination system configured to condition a radiation beam, and a support constructed to hold a patterning device. The patterning device is capable of imparting the radiation beam with a pattern in its cross-section to form a patterned radiation beam. The lithographic apparatus also includes a substrate table constructed to hold a substrate, a projection system configured to project the patterned radiation beam onto a target portion of the substrate, and a conduit system. The conduit system comprises a conduit configured to guide a liquid or liquid-gas mixture, and a gas injection nozzle configured to introduce a gas in the liquid or liquid-gas mixture to at least partially absorb pressure peaks or waves in the liquid or liquid-gas mixture.

According to an embodiment of the invention, there is provided a pump configured to pump a liquid or liquid-gas mixture. The pump comprises a pump inlet, a pump outlet, and a pump chamber between the pump inlet and the pump outlet in which, in use, the liquid or liquid-gas mixture is compressed. The pump further comprises a gas injection nozzle arranged to supply a gas to the liquid or liquid-gas mixture.

According to an embodiment of the invention, there is provided a method for substantially reducing pressure waves or pressure peaks in a conduit system for a liquid flow in a lithographic apparatus. Vibrations come into existence due to compression of liquid in the conduit system. The method includes injecting gas in the flow of liquid to at least partially absorb the pressure waves or pressure peaks.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 6 depicts a gas injection nozzle according to an embodiment of the invention;

FIG. 7 depicts a gas injection nozzle according to an embodiment of the invention;

DETAILED DESCRIPTION

Figure 1:
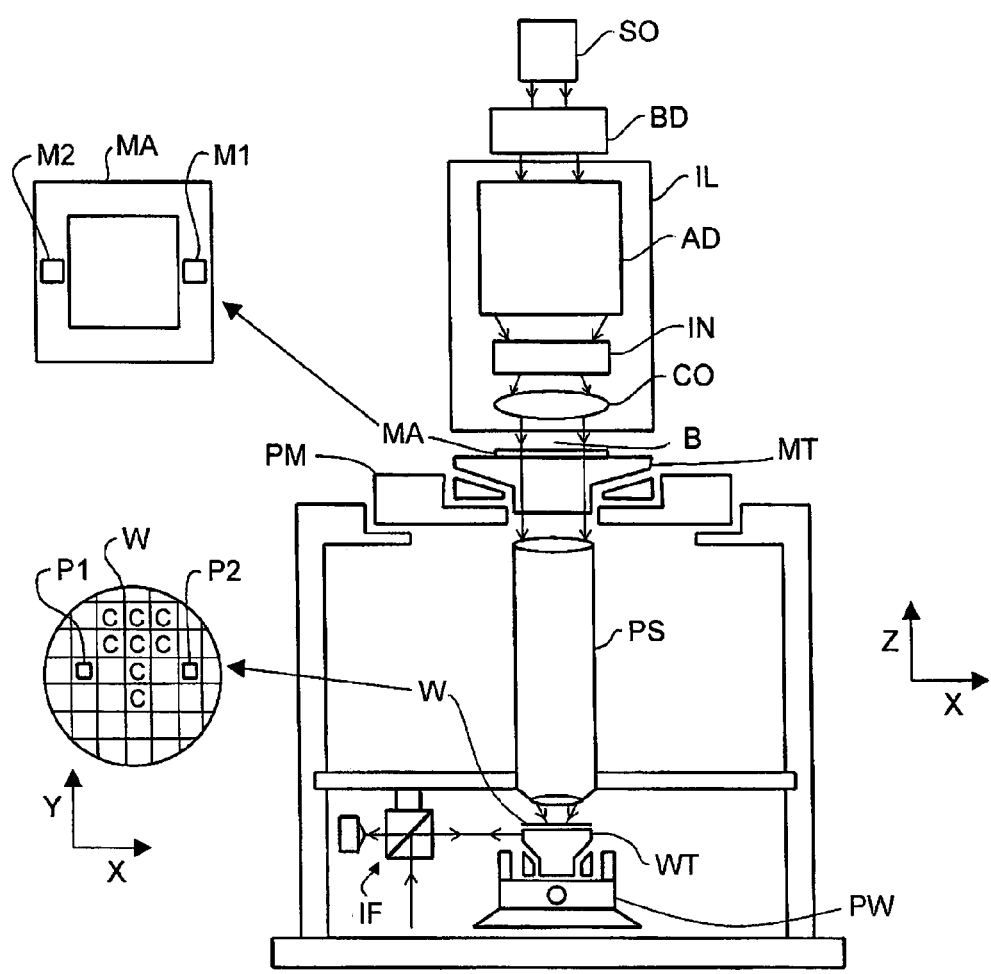
FIG. 1 depicts a lithographic apparatus according to an embodiment of the invention.

FIG. 1 schematically depicts a lithographic apparatus according to an embodiment of the invention. The apparatus includes an illumination system (illuminator) IL configured to condition a radiation beam B (e.g. UV radiation or any other suitable radiation), a support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures or supports may be used in parallel, or preparatory steps may be carried out on one or more tables and/or support structures while one or more other tables and/or support structures are being used for exposure.

The lithographic apparatus according to an embodiment of the invention is of a type wherein at least a portion of the substrate is covered by a liquid having a relatively high refractive index, e.g. water, so as to fill a space between the projection system and the substrate. However, the immersion liquid may also be applied to other spaces in the lithographic apparatus, for example, between the mask and the projection system. Immersion techniques are used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
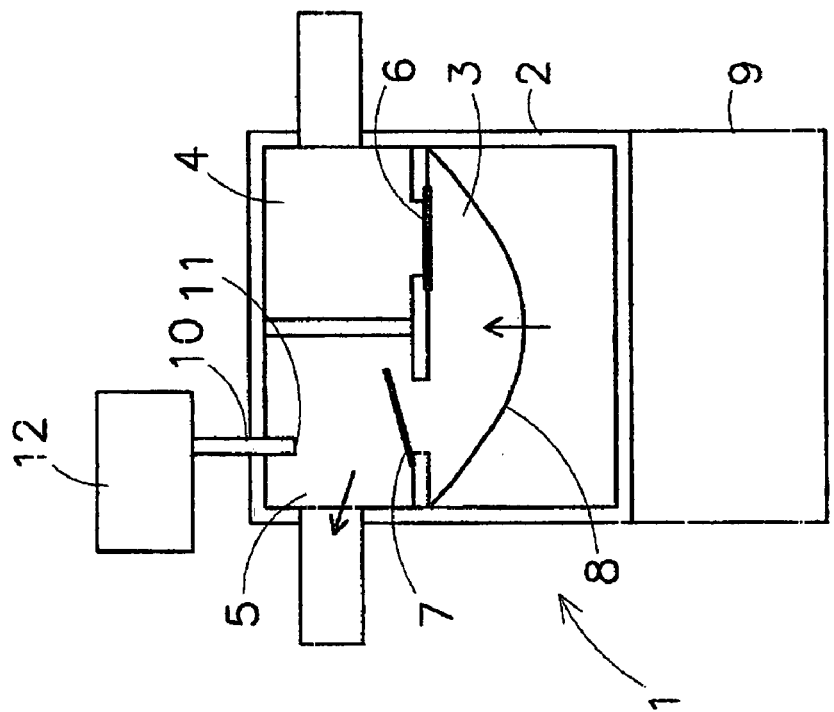
FIG. 4 depicts a cross section of a pump according to an embodiment according to the invention.
Figure 5:
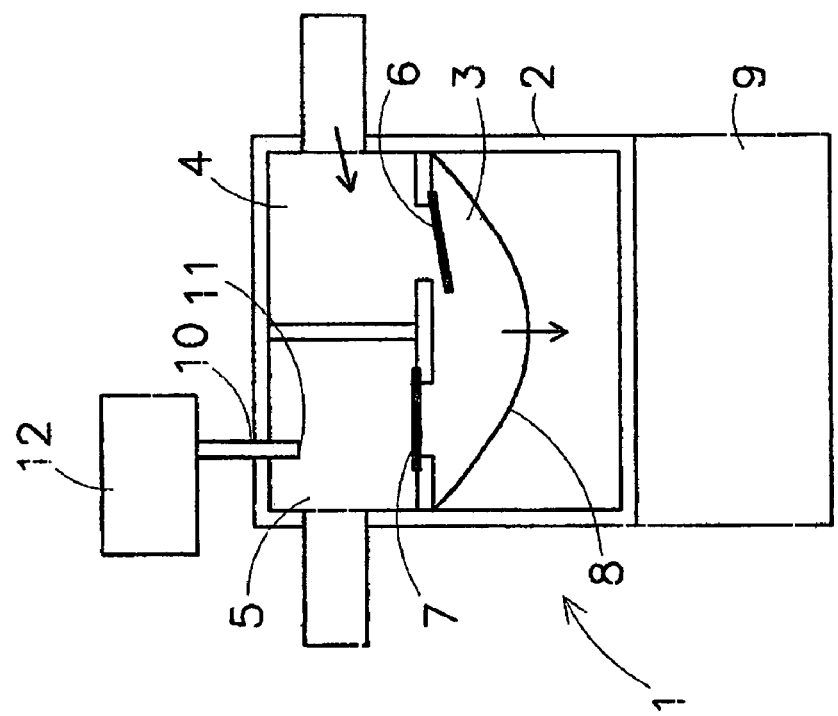
FIG. 5 depicts another cross section of the pump of FIG. 4.

FIGS. 4 and 5 show a cross section of a membrane pump 1 according to an embodiment of the invention. The membrane pump 1 comprises a pump housing 2 having a pump chamber 3. The pump chamber 3 is in flow communication with a pump inlet 4 and a pump outlet 5 via an inlet valve 6 and an outlet valve 7, respectively.

The pump chamber 3 of the membrane pump 1 is at the bottom side delimited by a membrane 8 which can be actuated by an actuation device 9 to increase and decrease the volume of the pump chamber 3. The pump actuation device 9 may be any device which is capable of moving the membrane 8 to subsequently increase and decrease the volume of the pump chamber 3. For instance, the pump actuation device 9 may use magnetic, electro-static, pressure or mechanical forces to move the membrane 8. Typically, a reciprocating arm is used to move the membrane 8, one end of the arm being connected to the membrane 8, the other end being connected to a motor providing a reciprocating movement, for instance a rotary motor provided with a crank mechanism.

In FIG. 4, the pump is depicted while the membrane is moved downwardly by the actuation device 9 to increase the volume of the pump chamber 3. As a result, the pressure in the pump chamber 3 will decrease and the inlet valve 6 will open to suck liquid or a liquid-gas mixture out of the liquid inlet 4. The outlet valve 7 is closed. The pump chamber 3 will fill with liquid or a liquid-gas mixture.

Subsequently, as shown in FIG. 5, the membrane 8 will be actuated by the actuation device 9 to move upwards. The pressure in the pump chamber 3 will increase. As a consequence of the increasing pressure in the pump chamber 3 the inlet valve 6 will close and the outlet valve 7 will open. The volume of the pump chamber 3 will be decreased to become substantially zero, and the liquid or liquid-gas mixture in the pump chamber will be pumped into the pump outlet 5.

As the actuation device 9 is capable of moving the membrane 8 to increase the volume of the pump chamber to a predetermined fixed position and consequently reduce it to substantially zero, the volume of pumped liquid or liquid-gas mixture is per pump stroke substantially constant. For this reason such a pump is called a constant volume pump or a positive displacement pump.

When solely liquid is pumped by the membrane pump 1, during decrease of the volume of the pump chamber 3, the compression of liquid in the pump chamber 3 may lead to pressure waves/peaks and consequent vibrations in the mechanical parts of the pump, in particular in the pump outlet 5 and a conduit connected to this pump outlet 5. These vibrations may have an unacceptable influence on the imaging accuracy of the lithographic apparatus as these vibrations may be propagated through the lithographic apparatus.

The above vibrations are substantially smaller when a gas-liquid mixture is pumped by the membrane pump 1 since due to the compressibility of the gas of the mixture, the pressure waves/peaks are absorbed within the gas-liquid mixture itself.

To substantially reduce the vibrations in the case solely liquid is pumped by the membrane pump 1, the pump is provided with a gas injection nozzle 10, which is configured to inject gas into the fluid flow pumped by the pump 1. By injecting a gas in the liquid flow, the pressure peaks/waves may be absorbed by the fluid itself due to the compressibility of the gas which is injected into the liquid. As a result, the occurrence of vibrations in the pump 1 may be substantially reduced.

In the embodiment shown in FIGS. 4 and 5, the discharge 11 of the gas injection nozzle 10 is arranged in the pump outlet 5. This has an advantage that the substantially constant volume which is pumped by the pump 1 in each pumping action, i.e. increase and subsequent decrease of the volume of the pump chamber 3, can be completely used for the pumping of the fluid entering the pump via the pump inlet 4.

In an alternative or additional embodiment, the gas injection nozzle 10 may be located in another location in the pump 1, for instance in the pump inlet 4 or the pump chamber 3. Such an embodiment may have an advantage that the injected gas is mixed with the liquid entering the pump so that the pressure peaks/waves may be absorbed more efficiently. However, since a quantity of gas is injected before or in the pump chamber 3, the volume of the fluid which has entered via the pump inlet 4 that will be pumped per pump stroke is smaller.

In the embodiment shown in FIGS. 4 and 5, the gas injection nozzle 10 is connected with a source of pressurized gas 12. This may be a compressor continuously providing a gas under pressure. Such a compressor may be provided especially for this purpose, or may be a compressor which is used for another application. Another or additional source of compressed gas may be used. The pressure of the compressed gas is desirably larger than the pressure within the pump outlet 5 during decrease of the volume of the pump chamber 3 so that at such moment still gas is injected in the liquid pumped by the pump 1. When the gas injection nozzle 10 is arranged in the pump inlet 4, the pressure of the gas may be lower.

In an embodiment, the gas injection nozzle 10 may be connected to a pump inlet conduit or a pump outlet conduit fixed to the pump inlet 4 or pump outlet 5, respectively. Such a pump inlet conduit or pump outlet conduit may be regarded to be a part of the pump inlet 4 or pump outlet 5. However, the gas is desirably injected close to the pump chamber 3.

The gas may continuously be injected in the pump. However, when the gas injection nozzle 10 is arranged in the pump outlet 5, the gas may only be injected during the volume decreasing stroke of the membrane 8. In contrast, when the gas injection nozzle 10 is arranged in the pump inlet 4, the gas may only be injected during the volume increasing stroke of the membrane 8. Due to the low pressure in the pump inlet during the increasing stroke, the gas does not necessarily have to be under pressure when being injected in the pump inlet 4. In an embodiment, the gas injection nozzle 10 comprises a one way valve so that no liquid or gas liquid mixture may be introduced from, for example, the pump chamber 3 into the gas injection nozzle 10. Such an embodiment may be advantageous when gas is not continuously injected.

The gas which is injected is, in an embodiment, air or a gas which is taken from the environment in which the pump is placed, for instance a vacuumed chamber. In an embodiment, the gas may be an inert gas, such as nitrogen or any other suitable type of gas.

FIG. 6 shows a gas injection nozzle 20 according to an embodiment of the invention. In FIG. 6, the pump, in particular the pump outlet 5, is only partially shown. The gas injection nozzle 20 is partially arranged in the outlet conduit or outlet fitting 21 which is connected with the pump outlet 5 by means of a screw connection 23. The discharge 22 of the gas injection nozzle 20 ends in the pump outlet 5. An advantage of this embodiment is that the pump housing 2 of the pump does not need to be changed in order to provide the gas injection nozzle 20 at a suitable location. Thus, a generally available pump may be used without the need to make alterations to the pump housing 2. A disadvantage may be that the gas injection nozzle is arranged in the pump outlet conduit 21 which may increase the flow resistance in the conduit for a fluid pumped by the pump.

FIG. 7 shows a gas injection nozzle 30 according to an embodiment of the invention. In FIG. 7, the pump, in particular the pump outlet 5, is only partially shown. In this embodiment, the gas injection nozzle 30 is integrated in the fitting 31. The fitting 31 comprises a substantially cylindrical inner part 34 of which the inner surface defines the outlet channel 35. This inner part 34 may be connected to a further conduit to guide the liquid and gas pumped by the pump from the outlet channel 35 to, for instance, a reservoir. Around the inner part 34 a substantially cylindrical outer part 36 is arranged. Between the outer surface of the inner part 34 and the inner surface of the outer part 36, a main gas space 37 of the injection nozzle 30 is formed. This gas space is in fluid connection with the ring shaped or substantially ring-shaped (in the form of a circle, or a square, etc.) discharge 32 and with a connection 38 on which a gas supply conduit is mounted. The gas supply conduit is connected to a source of pressurized gas 12. In the connection 38, a restriction 33 is arranged with which the gas flow from the discharge 32 into the pump outlet is controlled. The inner part 34 and the outer part 36 are mounted on the pump housing by means of a screw element 39.

The gas injection nozzle 30 is thus not arranged in the outlet channel 35, but arranged about the perimeter thereof. The discharge 32 ends in the pump outlet 5. The gas injection nozzle 30 comprises a restriction 33 to which a source of pressurized gas 12 is connected. Due to the restriction, a continuous but relatively small gas flow may be obtained in the pump outlet 5 and therewith vibrations due to pressure waves/peaks in the liquid may substantially be reduced. As the gas injection nozzle 30 is integrated in the fitting 31, no changes to the pump housing itself 2 need be made to provide the gas injection nozzle 30.

Hereinabove, a membrane pump 1 was disclosed wherein gas is injected via a gas injection nozzle 10 to substantially reduce vibrations in the pump when solely liquid is pumped. The injection of gas via a gas injection nozzle 10 may also be used for any other type of pump to reduce vibrations caused by pressure waves/peaks when solely liquid is pumped by such pump. Such other pumps having a gas injection nozzle are deemed to fall within the scope of the invention. Further, the gas injection nozzle 10 may also be used with a pump that pumps a liquid-gas mixture to, for example, increase the gas in the mixture to reduce vibrations.

Figure 8:
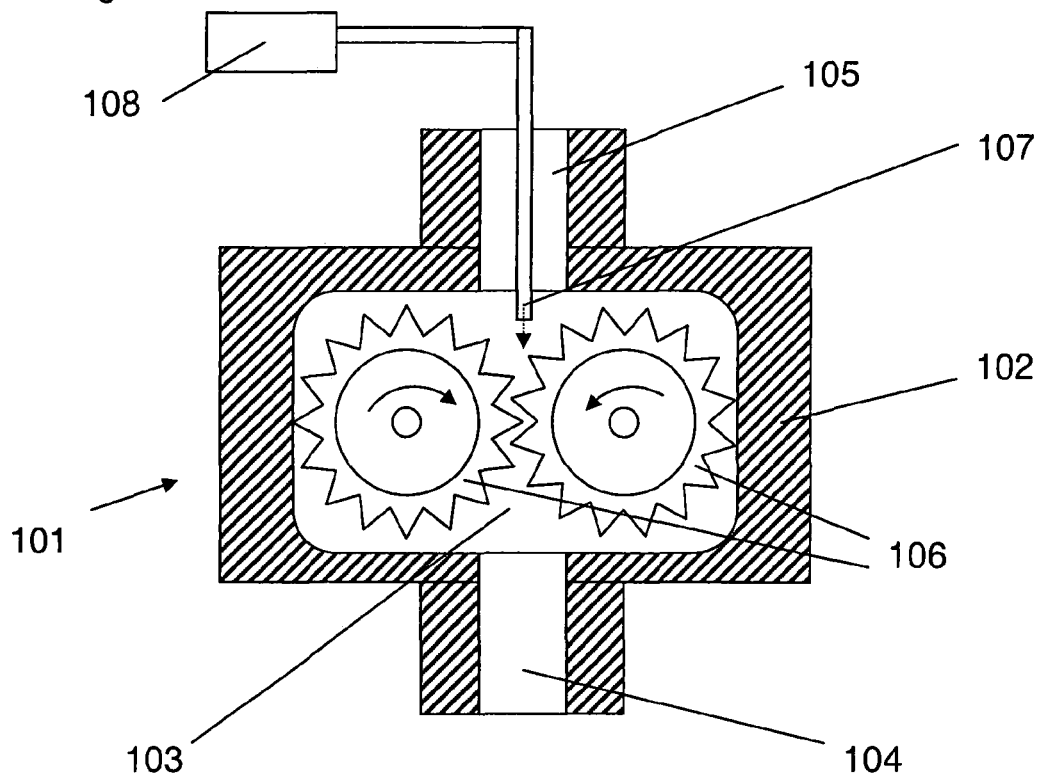
FIG. 8 depicts a cross-section of a pump according to an embodiment of the invention.

FIG. 8 shows a pump 101 according to an embodiment of the invention. As illustrated, the pump 101 is a gear pump. The pump 101 comprises a housing 102 that defines a pump chamber 103 and an inlet 104 and outlet 105. In the pump chamber 103, two meshing gears 106 are arranged which are rotatable by an actuation device (not shown) in opposed directions as indicated by arrows. Due to this rotation, liquid in the pump chamber 103 may be compressed and pumped towards the outlet 105. Due to the same rotations of the gears 106, new liquid may be drawn into the pump chamber 103 via the inlet 104. As a result, liquid may be continuously pumped by rotation of the gears 106. Gear pumps as such are known in the art.

Compression of the liquid by the gears 106 may lead, in particular when substantially only liquid is present in the pump chamber 103, to pressure peaks or waves in the liquid in the pump, which in turn may cause vibrations of the pump and/or the conduit system in which the pump is placed. As explained above, such pressure peaks and waves and the resulting vibrations are undesired. The vibrations typically have a frequency corresponding to the rotational speed divided by the number of gear teeth.

To avoid or suppress the above vibrations, a gas injection nozzle 107 is provided in the outlet 105. This gas injection nozzle 107 is configured to inject gas into the liquid. As a consequence, any pressure peaks or waves in the liquid may be absorbed by the gas bubbles injected in the liquid. The gas which is injected may, for instance, be supplied by a compressor or another source of pressurized gas 108.

The gas that is injected may be air or a gas which is taken from the environment in which the pump is placed, for instance a vacuumed chamber. As an alternative, the gas may be an inert gas, such as nitrogen or any other suitable type of gas.

The gas injection nozzle 107 may be placed at any other location in the pump such as the inlet 104 or in the pump chamber 103. It may also be possible to provide the gas injection nozzle 107 at another location in the conduit system in which the pump 101 is arranged, however, desirably close to the pump 101.

In practice, the provision of the gas injection nozzle 107 may be arranged for instance as shown in FIGS. 6 or 7. However, any other suitable arrangement may also be applied.

Figure 9:
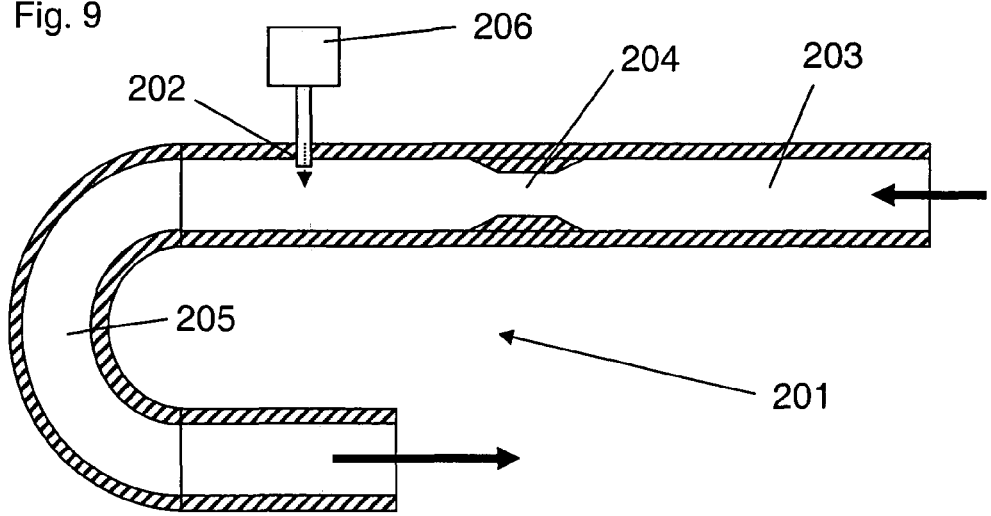
FIG. 9 depicts a part of a conduit system according to an embodiment of the invention.

FIG. 9 shows a part of a conduit system 201 in which a gas injection nozzle 202 according to an embodiment of the invention is shown. The conduit system 201 includes a conduit 203 in which a constriction 204 and a bend 205 are arranged. Liquid going through the Constriction 204 and/or bend 205 may lead to compression of the liquid at that location and, consequently, to pressure waves and peaks, which are undesirable.

By providing a gas injection nozzle 202 in the conduit system, desirably close to a location where a pressure wave or peak may be created, for example the constriction 204 or bend 205, gas may be injected in the liquid. The resulting gas bubbles may reduce the pressure peaks or waves and therewith the chance on vibrations in the system. The conduit system 201 may be any system in which liquid is pumped and may, for instance, be part of a cooling system or the immersion system described above. The provision of a gas injection nozzle may in particular be helpful in a complex cooling conduit system having a large number of conduits and/or many bends and/or constrictions. Such complex cooling systems may be found in substrate stages of a lithographic apparatus.

Figure 2:
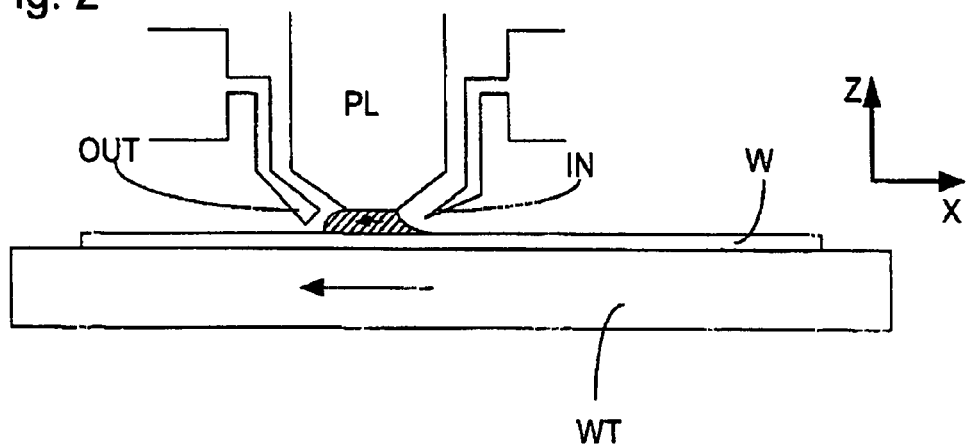
FIG. 2 depicts an exemplary embodiment of an immersion system of a lithographic apparatus.
Figure 3:
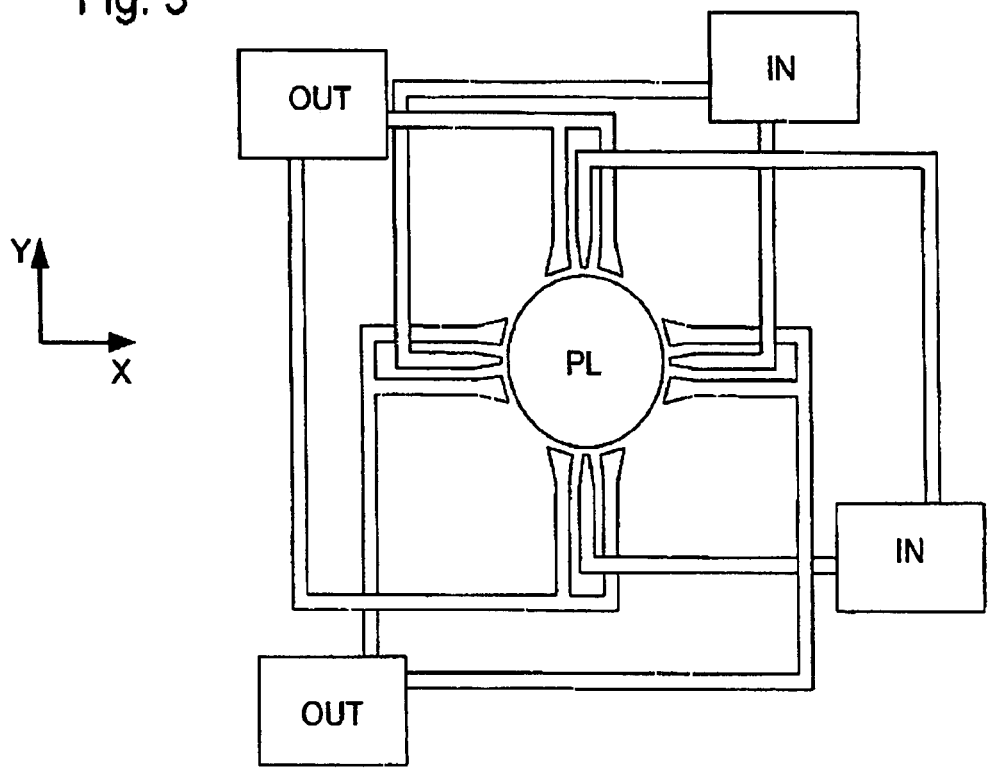
FIG. 3 depicts an exemplary embodiment of an immersion system of a lithographic apparatus.

One or more of the above described pumps may be used in an immersion system such as shown in FIGS. 2 and 3 or any other type of immersion system to pump a fluid to or from the immersion space. Other suitable applications of embodiments of the gas injection nozzle may be in the conduit system or pump of a cooling liquid circuit, for example a cooling water circuit for a substrate stage, reticle stage or projection system.

Due to the injection of gas, the occurrence of vibrations in the conduit system and, in particular the pump, and the lithographic apparatus may be substantially reduced. As a result, the imaging accuracy of the lithographic apparatus may be improved.

The conduit system, pump, or method, according to an embodiment of the invention, may also or alternatively be used in any other device in which it is desirable to substantially reduce vibrations caused by pressure waves/peaks when pumping liquid or a liquid-gas mixture.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

What is claimed is:

1. A conduit system for a lithographic apparatus, the conduit system comprising:
   a conduit part configured to guide a liquid or liquid-gas mixture; and
   a gas injection nozzle configured to introduce a gas in the liquid or liquid-gas mixture to at least partially absorb pressure peaks or waves in the liquid or liquid-gas mixture, wherein the gas injection nozzle is at least partially guided through or along a conduit or fitting connected to an outlet or inlet of a pump configured to pump the liquid or liquid-gas mixture of the conduit system, wherein a discharge of the gas injection nozzle ends in or close by the pump outlet or the pump inlet and wherein the gas injection nozzle is ring-shaped or mainly ring-shaped and arranged about the perimeter of the pump fitting or conduit.

2. The conduit system of claim 1, further comprising the pump, the pump comprising:
   the pump inlet,
   the pump outlet, and
   a pump chamber between the pump inlet and the pump outlet arranged for compression of the liquid or liquid-gas mixture, wherein the gas injection nozzle is arranged in the pump.

3. The conduit system of claim 2, wherein the pump further comprises an inlet valve in flow communication with the pump inlet and an outlet valve in flow communication with the pump outlet.

4. The conduit system of claim 2, wherein the pump chamber comprises a compression element configured to increase and decrease the volume of the pump chamber.

5. The conduit system of claim 4, wherein the compression element is a membrane.

6. The conduit system of claim 2, wherein the pump is a gear pump comprising one or more gears to compress the liquid or liquid-gas mixture.

7. The conduit system of claim 1, wherein a discharge of the gas injection nozzle is arranged in the pump outlet.

8. The conduit system of claim 1, wherein a discharge of the gas injection nozzle is arranged in the fitting of the pump.

9. The conduit system of claim 1, wherein the conduit system is a cooling water circuit.

10. The conduit system of claim 1, wherein the conduit system is part of an immersion system.

11. The conduit system of claim 1, wherein the gas injection nozzle is connected to a source of pressurized gas.

12. The conduit system of claim 11, wherein a pressure of the pressurized gas is higher than a pressure within the conduit system at least at a location where the gas is injected in the liquid or liquid-gas mixture.

13. A conduit system for a lithographic apparatus, the conduit system comprising:
   a conduit configured to guide a liquid or liquid-gas mixture; and
   a gas injection nozzle configured to introduce a gas in the liquid or liquid-gas mixture to at least partially absorb pressure peaks or waves in the liquid or liquid-gas mixture, wherein the gas injection nozzle is at least partially guided through or along a conduit or fitting connected to an outlet or inlet of a pump configured to pump the liquid or liquid-gas mixture of the conduit system and wherein the gas is introduced only during an increase of a volume of a pump chamber of the pump when a discharge of the gas injection nozzle is arranged in or close by the pump inlet and/or only during a decrease of the volume of the pump chamber when the discharge of the gas injection nozzle is arranged in or close by the pump outlet.

14. A lithographic apparatus comprising:
   a support constructed to hold a patterning device, the patterning device being capable of forming patterned radiation beam;
   a substrate table constructed to hold a substrate;
   a projection system configured to project the patterned radiation beam onto a target portion of the substrate; and a conduit system comprising:

a conduit part configured to guide a liquid or liquid-gas mixture, and a gas injection nozzle configured to introduce a gas in the liquid or liquid-gas mixture to at least partially absorb pressure peaks or waves in the liquid or liquid-gas mixture, wherein the gas injection nozzle is at least partially guided through or along a conduit or fitting connected to an outlet or inlet of a pump configured to pump the liquid or liquid-gas mixture of the conduit system, wherein a discharge of the gas injection nozzle ends in or close by the pump outlet or the pump inlet and wherein the gas injection nozzle is ring-shaped or mainly ring-shaped and arranged about the perimeter of the pump fitting or conduit.

15. The lithographic apparatus of claim 14, wherein the conduit system is part of an immersion system configured to provide a liquid between a first object and a second object, wherein the first object is the projection system and the second object is a substrate, when supported on the substrate table.

16. The lithographic apparatus of claim 14, wherein the conduit system is part of a cooling fluid system.

17. The lithographic apparatus of claim 16, wherein the cooling fluid system comprises a cooling water circuit of the substrate table.

18. A method for substantially reducing pressure waves or pressure peaks in a conduit system for a liquid flow in a lithographic apparatus, in which vibrations come into existence due to compression of liquid in the conduit system, the method comprising injecting gas in the flow of liquid to at least partially absorb the pressure waves or pressure peaks, wherein the injecting is at least partially guided through or along a conduit or fitting connected to an outlet or inlet of a pump configured to pump the liquid of the conduit system and wherein the injecting is performed only during an increase of a volume of a pump chamber of the pump when a discharge of the injecting ends in or close by the pump inlet and/or only during a decrease of the volume of the pump chamber when the discharge of the injecting ends in or close by the pump outlet.

19. The method of claim 18, wherein the gas is a compressed gas and is introduced via a gas injection nozzle arranged to discharge in or close to the pump outlet of the pump, in or close to the pump inlet of the pump, in the pump chamber, or close to a bend or constriction of the conduit system.

* * * * *

UNITED STATES PATENT AND TRADEMARK OFFICE
CERTIFICATE OF CORRECTION

| | | |
|---|---|---|
| PATENT NO. | : 7,843,548 B2 | Page 1 of 1 |
| APPLICATION NO. | : 11/907964 | |
| DATED | : November 30, 2010 | |
| INVENTOR(S) | : Martinus Wilhelmus Van Den Heuvel | |

It is certified that error appears in the above-identified patent and that said Letters Patent is hereby corrected as shown below:

On title page, item (75) Inventors
replace "Josephus Cornelis Johannes Antonlus Vugts"
with --Josephus Cornelis Johannes Antonius Vugts--.

Signed and Sealed this
Twenty-second Day of February, 2011

David J. Kappos
*Director of the United States Patent and Trademark Office*